United States Patent [19]

Lee

[11] Patent Number: 5,650,740

[45] Date of Patent: Jul. 22, 1997

[54] TTL DELAY MATCHING CIRCUIT

[75] Inventor: Teh-Kuin Lee, San Jose, Calif.

[73] Assignee: LSI Logic Corporation, Milpitas, Calif.

[21] Appl. No.: 632,206

[22] Filed: Apr. 15, 1996

Related U.S. Application Data

[63] Continuation of Ser. No. 262,427, Jun. 20, 1994, which is a continuation-in-part of Ser. No. 230,396, Apr. 20, 1994, abandoned.

[51] Int. Cl.$^6$ ........................................ H03K 5/13
[52] U.S. Cl. .......................... 327/262; 327/362; 327/284
[58] Field of Search ........................... 327/262, 284, 327/285, 362, 261, 149, 153, 158, 161, 277, 278, 270, 170, 263, 378, 264; 326/70, 71

[56] References Cited

U.S. PATENT DOCUMENTS

| | | | |
|---|---|---|---|
| 4,593,212 | 6/1986 | Svager | 307/475 |
| 4,746,823 | 5/1988 | Lee | 307/601 |
| 4,794,283 | 12/1988 | Allen et al. | 307/475 |
| 5,051,630 | 9/1991 | Kogan et al. | 307/603 |
| 5,079,439 | 1/1992 | Wanlass | 307/246 |
| 5,101,117 | 3/1992 | Johnson et al. | 307/269 |
| 5,107,153 | 4/1992 | Osaki et al. | 307/601 |
| 5,128,555 | 7/1992 | Millman | 307/443 |
| 5,352,945 | 10/1994 | Casper et al. | 307/603 |

FOREIGN PATENT DOCUMENTS

| | | | |
|---|---|---|---|
| 2189020 | 7/1990 | Japan | 327/261 |

*Primary Examiner*—Timothy P. Callahan
*Assistant Examiner*—Eunja Shin
*Attorney, Agent, or Firm*—Townsend and Townsend and Crew LLP

[57] ABSTRACT

A circuit for holding constant the propagation delay time at an output terminal in response to an input signal having a varying transition time from one logic state to another logic state at an input terminal is provided. The circuit has a plurality of inverters, each inverter having an input node and an output node, connected in series between the input terminal and the output terminal. The circuit also has a first capacitive means coupled to one of the first inverter output nodes through a switch, and has a means coupled between the input terminal and the switch for engaging the switch to couple the capacitive means to one of the first inverter output nodes. The engaging means is timed to couple the capacitive means responsive to the transition time of the input signal whereby the propagation delay time at the output terminal is constant.

16 Claims, 3 Drawing Sheets

5,650,740

TTL DELAY MATCHING CIRCUIT

This is a continuation of application No. 08/262,427, filed Jun. 20, 1994, which is a continuation-in-part of application No. 08/230,396, filed Apr. 20, 1994, now abandoned.

BACKGROUND OF THE INVENTION

The present invention is related to delay matching circuits and, more particularly, to delay matching circuits useful for translating TTL-level clock signals into MOS logic level signals for a phase-locked loop circuit in an integrated circuit.

A phase-locked loop circuit is used typically to generate an accurate frequency. Often the reference frequency is carried by a signal which swings between different digital logic levels than the digital logic levels used by the phase-locked loop (PLL) circuit. A converter circuit must be used to convert the logic levels of the incoming signals to the logic levels used by the PLL. A typical conversion system is illustrated in FIG. 1. An incoming clock signal at TTL (transistor-transistor logic) levels is received at an input terminal 13. A TTL converter circuit 11 changes the logic levels of the incoming signals to those of the PLL circuit 10, in this case, MOS logic levels. The output signals of the PLL circuit are fed back to a delay circuit 12, which returns the PLL signals for phase comparison with the signals from the circuit 11. The PLL circuit 10 tries to match the phases of the two incoming signals.

For the PLL circuit 10 to accurately follow the phase of the input clock signal, the low-to-high propagation delay time $T_{LH}$ of both input signals to the PLL circuit 10 should be very closely matched to each other even as the rise time of the input clock signal varies.

The problem with existing circuits used for previous converter circuits 11 and delay circuits 12 of FIG. 1 has been that the $T_{LH}$ of these circuits do not necessarily match each other as the rise time of the input clock signal varies. The $T_{LH}$ of the TTL converter circuit 11 is related to the rise time of the input clock signal. On the other hand, the delay circuit 12, typically has an output signal having a $T_{LH}$ which is directly related to the rise time of the feedback output signal of the PLL circuit 10, not the input clock signal. This is not satisfactory.

The present invention provides for a delay matching circuit suitable for both converter circuit 11 and the delay circuit 12 so that the $T_{LH}$ of the output signals are invariant to changes in the rise times of the input clock signal and hence the $T_{LH}$ of the output signals remain matched. In this manner the PLL circuit can accurately track the phase of the incoming clock signal.

SUMMARY OF THE INVENTION

The present invention provides for a circuit for holding constant the low-to-high propagation delay time $T_{LH}$ at an output terminal in response to an input signal having a varying rise time at an input terminal. The circuit has a plurality of inverters, each inverter having an input node and an output node, connected in series between the input terminal and the output terminal. The circuit also has a first capacitive means coupled to one of the first inverter output nodes through a switch, and has a means coupled between the input terminal and the switch for engaging the switch to couple the capacitive means to one of the first inverter output nodes. The engaging means is timed to couple the capacitive means responsive to the rise time of the input signal whereby the $T_{LH}$ at the output terminal is constant.

BRIEF DESCRIPTION OF THE DRAWINGS

A more detailed understanding of the present invention may be achieved by perusing the following Detailed Description Of Preferred Embodiment(s) of the present invention with reference to the following drawings.

DETAILED DESCRIPTION OF PREFERRED EMBODIMENT(S)

Figure 1:
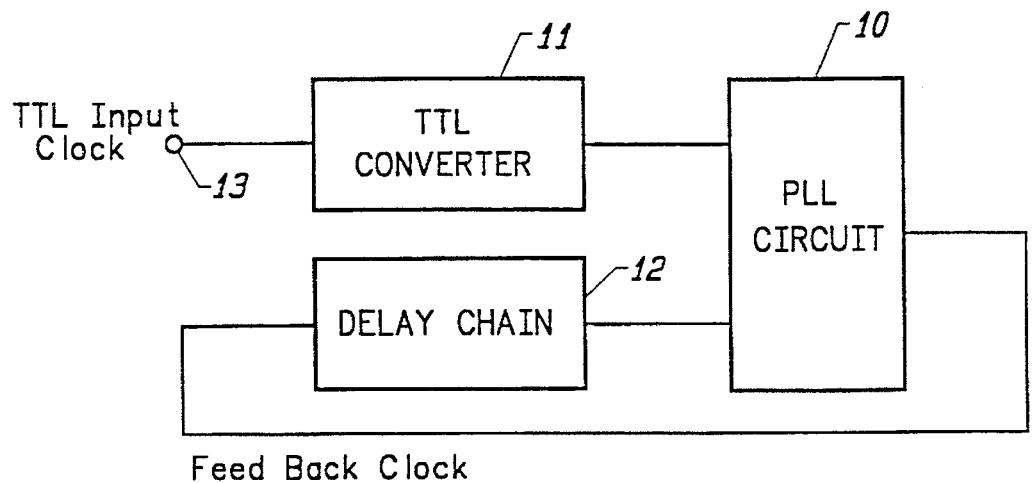
FIG. 1 is a block diagram organization of a TTL converter circuit and delay circuit for a PLL circuit as found in the prior art.
Figure 2:
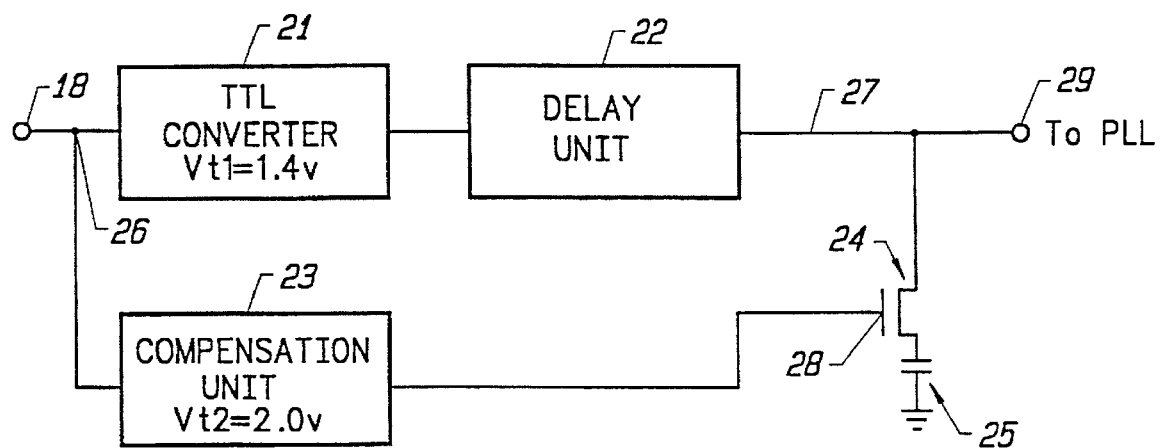
FIG. 2 is a diagram of a delay matching circuit useful for both the TTL converter and delay circuits according to one embodiment of the present invention.

The present invention provides for delay matching circuits which are suitable for both the TTL converter circuit 11 and the delay circuit 12 of FIG. 1. FIG. 2 illustrates the general arrangement of an embodiment of the delay matching circuit for the TTL converter circuit 11.

The delay matching circuit has a converter unit 21 which is connected to an input terminal 18 and a delay unit 22. The delay unit 22 is also connected to an output terminal 29 of the delay matching circuit. The delay matching circuit also has a compensation unit 23 which is connected to the input terminal 18 by a node 26 to drive a control terminal 28 of a switch 24. The switch 24 connects a capacitive load 25 to signal path from the input terminal 18 to the output terminal 29 at a node 27.

The TTL converter unit 21 is an ordinary TTL converter, i.e., an inverter having a switching or threshold voltage set to handle the range of TTL level signals, 0.0 to 3.0 V, from the input terminal 18 which is connected to the input terminal 13 in FIG. 1. The threshold voltage, $V_{T1}$, for the converter circuit 21 is set at 1.4 V, slightly less than half the TTL voltage swing between logic levels. It is well known to integrated circuit designers how to set the threshold voltage of an inverter. The output of the circuit 21 is at MOS logic levels, i.e., between 0 and +5 V. These level-translated signals are passed to the delay unit 22 which passes the digital signals at the MOS logic levels to the output terminal 29 which is connected to the PLL 10.

The compensation unit 23 delays the signal from the input terminal 18 and passes the signal to the control terminal 28 of the switch 24. As shown in FIG. 2, the switch 24 is represented by an NMOS transistor and the control terminal 28 the transistor's gate electrode. The NMOS transistor is connected to the node 27 and to the capacitive loading 25 represented by a capacitor. The compensation unit 23 has at least one inverter. The threshold voltage of the inverter, $V_{T2}$, is set at +2 V, higher than that of the TTL conversion circuit 21.

The result is that when the rise time of the TTL input signal is short, such as 1.0 ns, the delay time for each of the inverters is little affected by the threshold voltages, $V_{T1}$ and $V_{T2}$. Thus, the $T_{LH}$ for the signal traveling from the input terminal 18 through the converter unit 21 and delay unit 22 to the node 27 is slower than for the comparable signal from the input terminal 18 to the NMOS transistor's gate electrode, control terminal 28, which is connected to the output node of the compensation unit 23. The NMOS transistor, the switch 24, is turned on quickly to load the capacitor 25 onto the node 27 before the signal from the input terminal 18 travels through the TTL converter unit 21 and the delay unit 22. The capacitive loading on the node 27 increases the $T_{LH}$ of the signal at the node 27.

As the rise time for the input signal on the terminal 18 increases, the difference in threshold voltages for the TTL converter 21 and the compensation circuit 23 causes the input signal to pass through the converter unit 21 and delay unit 22 before the corresponding signal passes through the compensating unit 23 to the control terminal 28. Thus, the $T_{LH}$ of the signal at the output terminal 29 is not increased by the loading of the capacitor 25. This explains the general operation of the delay matching circuit.

Figure 3:
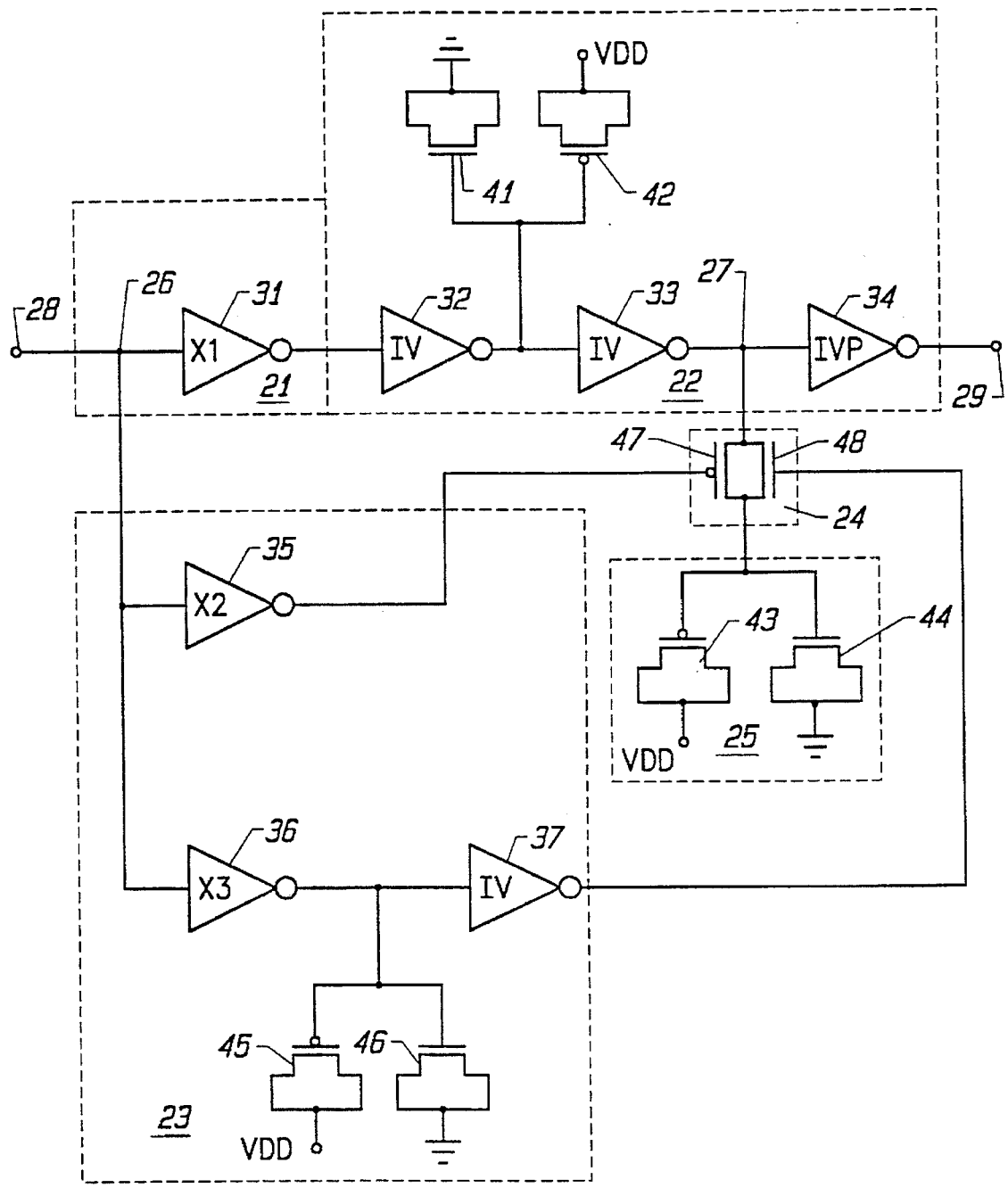
FIG. 3 is a detailed circuit diagram of a delay matching circuit.

FIG. 3 shows the details of the delay matching circuit for the TTL converter circuit 11 in accordance with the present invention. Where the elements in the drawing have the same function, the same reference numerals are used in FIG. 3 as in FIGS. 1 and 2.

The TTL converter unit 21 is represented by an inverter 31 which has its threshold voltage set at 1.4 V. The output node of the inverter 31 is connected to an input node of an inverter 32, which is part of the delay unit 22. The output node of the inverter 32 is connected to the input node of an inverter 33 and the gate electrodes of an NMOS transistor 41 and a PMOS transistor 42. The source and drain regions of the NMOS transistor 41 are commonly connected to a power supply at ground, while the source and drain regions of the PMOS transistor 42 are connected to the positive voltage supply at $V_{DD}$, +5 V. The two transistors 41 and 42 operate as a capacitive load on the signals from the inverter 31 to the inverter 33. Although this embodiment utilizes a pair of transistors as a capacitance load, it will be apparent to one skilled in the art that other devices may be substituted without departing from the scope of the present invention.

The inverter 33 has an output node connected to the input node of an inverter 34 which has its output node connected to the output node 29. Connected to the node 27 between the output node of the inverter 33 and input node of the inverter 34 is the switch 24 represented by a PMOS transistor 47 and NMOS transistor 48. The two transistors 47 and 48 are also connected to a capacitive load formed by a PMOS transistor 43 and NMOS transistor 44. The source and drain regions of the PMOS transistor 43 are connected to the positive voltage supply at $V_{DD}$ and the source and drain regions of the NMOS transistor 44 are connected to the ground voltage supply. The switch 24 is activated by the compensation unit 23, which is formed by an inverter 35 which has an input node connected to a node 26 connected to the input node of the inverter 31. The inverter 35 has an output node connected to the gate electrode of the PMOS transistor 47. Also part of the compensation circuit is an inverter 36 which also has its input node connected to the node 26 which has an output node connected to the input node of an inverter 37. The inverter 37 has an output node connected to the gate electrode of the NMOS transistor 48.

Between the output node of the inverter 36 and the input node of the inverter 37 is a capacitive load formed by a PMOS transistor 45 and an NMOS transistor 46. The two transistors 45 and 46 have their gate electrodes commonly connected and the source and drain region of the PMOS transistor 45 connected to the $V_{DD}$ power supply and the source and drain region of the NMOS transistor connected to the ground power supply.

The inverter 35 and PMOS transistor 47, and the inverters 36 and 37 and the NMOS transistor 48 operate in the same general manner as described with respect to the compensation unit in FIG. 2. However, the two sets of inverters, 35, and 36 and 37 operate to smooth out the capacitive loading as the rise time of the input signal varies. By adjusting the threshold voltages of the inverters 31, 35 and 36 which receive the input signal and the different capacitive loads on the signal paths connected to the output nodes of the inverters 31, 35 and 36, the capacitive loading of the transistors 43 and 44 can be timed so that the low-to-high propagation delay time $T_{LH}$ of the signal at the output terminal 29 is fairly constant over the range of possible rise times of the input signal.

In an embodiment of the present invention, the inverters 31, 35 and 36 are implemented by a pair of MOS transistors, one p-channel and one n-channel, connected in series. The threshold voltages of the inverters 31, 35 and 36 are adjusted by changing the ratio of the polygate widths of the NMOS and PMOS transistors that constitute each inverter. An example of the polygate width ratios for the inverters of the TTL delay circuit, where X1, X2 and X3 are the inverters 31, 35 and 36 respectively, is as follows:

|    | PMOS:NMOS |
|----|-----------|
| X1 | 1:4       |
| X2 | 1:1       |
| X3 | 1:3       |

Figure 4:
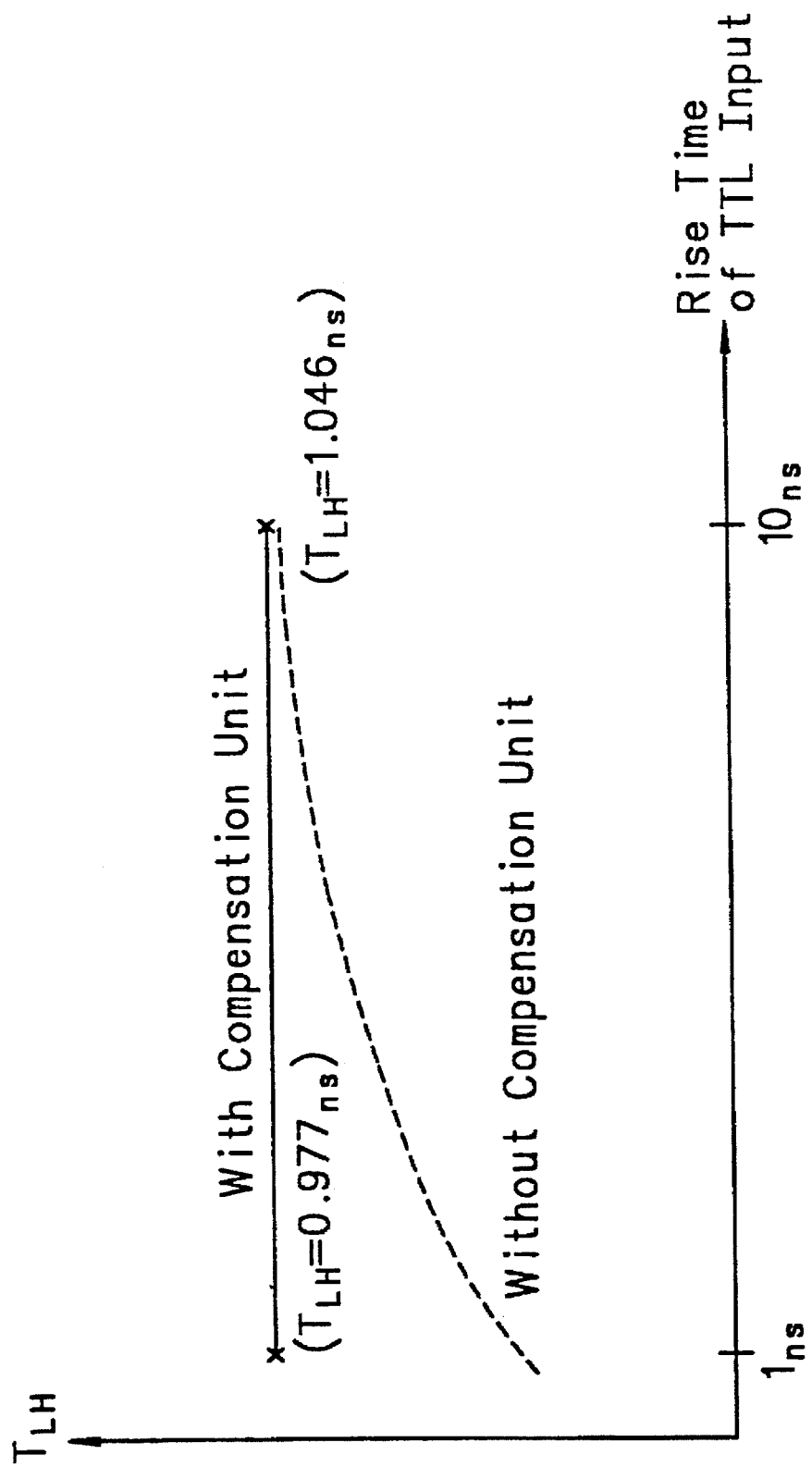
FIG. 4 is a graph of the low-to-high propagation delay time $T_{LH}$ of the output signal versus the low-to-high rise time of the input signal of the delay matching circuit.

FIG. 4 demonstrates the performance of the present invention in a graph of the output $T_{LH}$ on the vertical axis versus a variation of the input rise time on the horizontal axis of the delay matching circuit. As can be seen, $T_{LH}$ is fairly constant with the described compensation circuit. Such is not the case if the compensation circuit is removed from the circuit.

The described circuit may also be used for the delay circuit 12 shown in FIG. 1. In this case, the input terminal 18 is connected to the output terminal of the PLL circuit 10 and the threshold voltage, $V_{T1}$, of the inverter 31 is set at a voltage appropriate to the MOS logic level signals of the PLL circuit. In this manner, as the transition time from low to high logic levels, of the input clock signal varies, the low-to-high propagation delay time $T_{LH}$ of both output signals from the TTL converter circuit 11 and the delay circuit 12 remains constant for the proper functioning of the PLL circuit 10.

In an embodiment of the present invention operating as a delay circuit, the inverters 31, 35 and 36 may be implemented by a pair of MOS transistors, one p-channel and one n-channel, connected in series as described earlier. An example of the polygate width ratios for the delay circuit, where X1, X2 and X3 are the inverters 31, 35 and 36 respectively, is as follows:

|    | PMOS:NMOS |
|----|-----------|
| X1 | 1:1       |
| X2 | 3:1       |
| X3 | 3:2       |

While the above is a complete description of the preferred embodiments of the invention, various alternatives, modifications and equivalents may be used. It should be evident that the present invention is equally applicable by making appropriate modifications to the embodiments described above. For example, the present invention has been described as operating on the rise time of the input clock signal but may be modified to operate on the fall time as well. Therefore, the above description should not be taken as limiting the scope of the invention which is defined by the metes and bounds of the appended claims.

What is claimed is:

1. A circuit comprising:

a plurality of first inverters, each first inverter having an input node and an output node, said first inverters connected in series between an input terminal of said circuit and an output terminal of said circuit;

first capacitive means coupled to one of said first inverter output nodes through a switch; and means coupled between said input terminal and said switch for engaging said switch to couple said capacitive means to said one of said first inverter output nodes, said engaging means having an activation threshold that differs from an activation threshold of one of said plurality of first inverters so that the propagation delay time at said output terminal is held substantially constant even though transition times from one logic state to another logic state at said input terminal vary.

2. The circuit of claim 1 wherein a first inverter having its input node connected to said input terminal comprises a converter of TTL level signals to MOS level signals.

3. The circuit of claim 1 wherein said engaging means comprises a second circuit having an input node connected to said input terminal and an output node connected to said switch, said second circuit timed to couple said capacitive means responsive to the transition time of said input signal.

4. The circuit of claim 3 wherein said second circuit comprises an inverter having an input node connected to said input terminal and an output node connected to said switch.

5. The circuit of claim 3 wherein said engaging means further comprises a third circuit having an input node connected to said input terminal and an output node connected to said switch, said third circuit timed to couple said capacitive means responsive to the transition time of said input signal at a time different from said second circuit.

6. The circuit of claim 5 wherein said third circuit comprises a plurality of inverters connected in series between said input terminal and said switch, one of said inverters having an input node connected to said input terminal.

7. The circuit of claim 6 further comprising a second capacitive means coupled to a first inverter output node.

8. The circuit of claim 6 further comprising a third capacitive means coupled to a second inverter output node.

9. The circuit of claim 1 further comprising a second capacitive means coupled to a first inverter output node.

10. A circuit comprising:

a plurality of first inverters, each first inverter having an input node and an output node, said first inverters connected in series between an input terminal of said circuit and an output terminal of said circuit;

a first capacitor coupled to one of said first inverter output nodes through a switch; and a second circuit coupled between said input terminal and said switch that engages said switch to couple said capacitor to said one of said first inverter output nodes, said second circuit having an activation threshold that differs from an activation threshold of one of said plurality of first inverters so that the propagation delay time at said output terminal is held substantially constant even though transition times from one logic state to another logic state at said input terminal vary.

11. The circuit of claim 10 wherein a first inverter having its input node connected to said input terminal comprises a converter of TTL level signals to MOS level signals.

12. The circuit of claim 10 wherein said second circuit comprises an inverter having an input node connected to said input terminal and an output node connected to said switch.

13. The circuit of claim 10 further comprising a third circuit having an input node connected to said input terminal and an output node connected to said switch, said third circuit timed to couple said capacitor responsive to the transition time of said input signal at a time different from said second circuit.

14. The circuit of claim 13 wherein said third circuit comprises a plurality of second inverters, each second inverter having an input node and an output node, said second inverters connected in series between said input terminal and said switch, one of said second inverters having an input node connected to said input terminal.

15. The circuit of claim 10 further comprising a second capacitor coupled to a first inverter output node.

16. The circuit of claim 14 further comprising a third capacitor coupled to a second inverter output node.

* * * * *